US012417890B2

United States Patent
Cong et al.

(10) Patent No.: US 12,417,890 B2
(45) Date of Patent: Sep. 16, 2025

(54) METHODS, SYSTEMS, AND APPARATUS FOR MONITORING RADIATION OUTPUT OF LAMPS

(71) Applicant: Applied Materials, Inc., Santa Clara, CA (US)

(72) Inventors: Zhepeng Cong, San Jose, CA (US); Ashur J. Atanos, San Jose, CA (US); Khokan C. Paul, Cupertino, CA (US); Tao Sheng, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/381,146

(22) Filed: Oct. 17, 2023

(65) Prior Publication Data

US 2024/0136140 A1  Apr. 25, 2024
US 2024/0234073 A9  Jul. 11, 2024

Related U.S. Application Data

(60) Provisional application No. 63/419,219, filed on Oct. 25, 2022.

(51) Int. Cl.
*H01J 9/50* (2006.01)
*G01T 1/185* (2006.01)
*G01J 1/42* (2006.01)

(52) U.S. Cl.
CPC ............. *H01J 9/50* (2013.01); *G01T 1/185* (2013.01); *G01J 2001/4247* (2013.01)

(58) Field of Classification Search
CPC ...................................................... H01J 9/50
See application file for complete search history.

(56) References Cited

U.S. PATENT DOCUMENTS 4,871,263 A   10/1989  Wilson
5,436,443 A    7/1995  Abtahi
(Continued)

FOREIGN PATENT DOCUMENTS

KR   20030069268 A   8/2003
WO   2023211520 A1  11/2023
WO   2024091405 A1   5/2024

OTHER PUBLICATIONS

International Search Report and Written Opinion dated Jan. 30, 2024 for Application No. PCT/US2023/035333.

*Primary Examiner* — Joseph L Williams
(74) *Attorney, Agent, or Firm* — Patterson + Sheridan, LLP

(57) ABSTRACT

Embodiments of the present disclosure relates to methods, systems, and apparatus for monitoring radiation output of lamps of processing chambers. In some embodiments, a system contains a plurality of lamps coupled to a chamber, and one or more radiation sensors. Each lamp is identified with one or more zones, the radiation sensors are coupled to the chamber, where each radiation sensor is proximal at least one lamp. A controller contains instructions that, when executed, cause: the radiation sensors to convey, to the controller, information associated with radiation emitted by the lamps; the controller to analyze the information, the analyzing including: for each zone: determining a function of radiation over time; and monitoring the function for a condition associated with lamp aging; and the controller to, based on the analyzing the information, perform at least one of the following: vary input power delivered to the lamps; and generate an alert.

16 Claims, 4 Drawing Sheets

(56) References Cited

U.S. PATENT DOCUMENTS

| | | |
|---|---|---|
| 5,727,017 A | 3/1998 | Maurer et al. |
| 5,830,277 A * | 11/1998 | Johnsgard ......... H01L 21/67248 118/712 |
| 6,179,466 B1 | 1/2001 | Peuse et al. |
| 7,744,274 B1 | 6/2010 | Grek et al. |
| 8,483,991 B2 | 7/2013 | Gaertner et al. |
| 8,668,383 B2 | 3/2014 | Timans |
| 9,735,034 B2 | 8/2017 | Vellore et al. |
| 10,132,003 B2 | 11/2018 | Lau et al. |
| 10,356,848 B2 | 7/2019 | Samir et al. |
| 10,813,202 B2 | 10/2020 | Kim et al. |
| 10,903,066 B2 | 1/2021 | Nguyen et al. |
| 11,057,963 B2 | 7/2021 | Cong et al. |
| 11,107,709 B2 | 8/2021 | Wirth |
| 11,114,327 B2 | 9/2021 | Boyd, Jr. et al. |
| 11,162,845 B2 | 11/2021 | Ranish |
| 11,473,196 B2 | 10/2022 | Ohashi et al. |
| 11,562,915 B2 | 1/2023 | Hu et al. |
| 2014/0067324 A1 | 3/2014 | Ho et al. |
| 2015/0041453 A1 | 2/2015 | Vellore et al. |
| 2015/0131698 A1 | 5/2015 | Vellore et al. |
| 2016/0227606 A1 | 8/2016 | Samir et al. |
| 2019/0067070 A1 | 2/2019 | Boyd, Jr. et al. |
| 2022/0301904 A1 | 9/2022 | Hu et al. |

\* cited by examiner

# METHODS, SYSTEMS, AND APPARATUS FOR MONITORING RADIATION OUTPUT OF LAMPS

CROSS-REFERENCE TO RELATED APPLICATIONS

This application claims benefit to U.S. Prov. Appl. No. 63/419,219, filed on Oct. 25, 2022, which is herein incorporated by reference in its entirety.

BACKGROUND

Field

Embodiments of the present disclosure relate to methods, systems, and apparatus for monitoring radiation output of lamps of substrate processing chambers. In one aspect, the lamps are monitored to determine if one or more lamps are in need of replacement.

Description of the Related Art

Lamps used in heating as part of substrate processing operations can age, degrade, and fail, resulting in increased machine downtimes and reduced product throughput. Lamp aging, degradation, and/or failure can also hinder device performance. Depending on operations, lamps can age at differing rates. For example, lamps located in different regional zones of a processing chamber may age differently. Consequently, identical input power provided to different regional zones may result in differing radiation output from the lamps of each zone. Certain lamp monitoring operations lack precision (e.g., lamp filament resistance detection), thus can only detect the lamp resistance shifting when a number of lamps have shifted resistance. Certain lamp aging effect can only be detected with on wafer process result, such as thickness profile.

Therefore, there is a need for improved lamp monitoring methods, systems, and apparatus that enable predicting lamp aging to facilitate reduced machine downtime, accurate lamp aging monitoring, increased throughput, and enhanced device performance.

SUMMARY

Embodiments of the present disclosure relate to methods, systems, and apparatus for monitoring radiation output of lamps of substrate processing chambers. In one aspect, the lamps are monitored to determine if one or more lamps are in need of replacement.

In one or more embodiments, a system for processing substrates includes: a processing chamber containing a processing volume, a plurality of lamps coupled to the processing chamber, wherein each of the lamps is identified with one or more zones, one or more radiation sensors coupled to the processing chamber, wherein each radiation sensor is proximal at least one lamp, and a controller containing instructions that, when executed by a processor, cause the one or more radiation sensors to convey, to the controller, information associated with radiation emitted by the plurality of lamps, the controller to analyze the information, the analyzing containing: for each zone: determining a function of radiation over time, and monitoring the function for a first condition associated with lamp aging, and the controller to, based on the analyzing the information, perform at least one of the following actions: vary input power delivered to at least one of the lamps, and generate an alert.

In other embodiments, a method of monitoring a plurality of lamps of a processing chamber includes identifying each of the lamps with one or more zones; collecting radiation emitted by the plurality of lamps, generating information about the collected radiation for each zone, analyzing the information, the analyzing containing: for each zone: determining a function of radiation over time; and monitoring the function for a first condition associated with lamp aging, and based on the analyzing the information, performing at least one of the following actions: varying input power delivered to at least one of the lamps, and generating an alert.

In some embodiments, a system includes a non-transitory computer readable storage medium having stored thereon, computer-executable instructions that, when executed by a processor, cause the processor to perform a method of monitoring a plurality of lamps of a processing chamber, the method containing: identifying each of the lamps with one or more zones, collecting radiation emitted by the plurality of lamps, generating information about the collected radiation for each zone, analyzing the information, the analyzing containing: for each zone: determining a function of radiation over time, and monitoring the function for a first condition associated with lamp aging, and based on the analyzing the information, performing at least one of the following actions: varying input power delivered to at least one of the lamps, and generating an alert.

In one or more embodiments, a radiation sensor for a processing chamber for processing substrates includes: a sensor unit capable of detecting radiation in the wavelength range of about 300 nm to about 5,000 nm, a sensor cap that caps the sensor unit and contains silicon carbide coated graphite, and a shielding base capable of thermally isolating the sensor unit from its support structure, wherein: the radiation sensor is configured to detect radiation emitted by one or more of a plurality of lamps of the processing chamber, each of the plurality of lamps is identified with one or more zones of the processing chamber, and the radiation sensor is configured to generate information about the detected radiation for one of the zones.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to methods, systems, and apparatus for monitoring radiation output of lamps of substrate processing chambers. In one aspect, the lamps are monitored to determine if one or more lamps are in need of replacement.

Embodiments of the present disclosure may provide improved lamp monitoring methods, systems, and apparatus that enable predicting lamp aging to facilitate reduced machine downtime, accurate monitoring, increased throughput, and enhanced device performance. For example, embodiments of the present disclosure may provide improved systems and methods for monitoring and/or controlling lamps, such as infrared lamps, utilized in processing chambers, such as epitaxial deposition processing chambers. Consequently, embodiments of the present disclosure may improve accuracy of lamp monitoring over that of conventional systems. Embodiments of the present disclosure may beneficially control one or more lamps based, at least in part, on the radiation output detected from the one or more lamps. For example, the one or more lamps may be assigned to regional zones within the processing chamber, and the radiation output may be analyzed according to the zone from whence it originated, while each control instruction may be applicable to the lamps of a single zone. Advantageously, the one or more lamps may be controlled to compensate for lamp-aging differences, such as filament sagging, filament breakage, short-circuiting between filament turns, and/or deposition on the envelope of a lamp. Consequently, embodiments of the present disclosure may provide monitoring and/or control of processing chamber lamps that operates independently, without requiring other hardware (e.g., external hardware) or user intervention (e.g., visual inspection of lamps, manual adjustment of input power). Embodiments of the present disclosure may include systems and methods that automate control of lamp power input. Lamp control based, at least in part, on the radiation output detected from the lamp avoids the technical problems associated with manual and/or visual inspection of lamps, such as lack of precision and inefficiencies. Improved precision in lamp control improves precision in chamber temperature control, thereby providing more predictable deposition results and substrate processing. Improved monitoring and/or controlling of lamps, as provided by embodiments disclosed herein, may reduce machine downtimes, increase product throughput, and provide more precision and/or efficiency in device performance.

Figure 1:
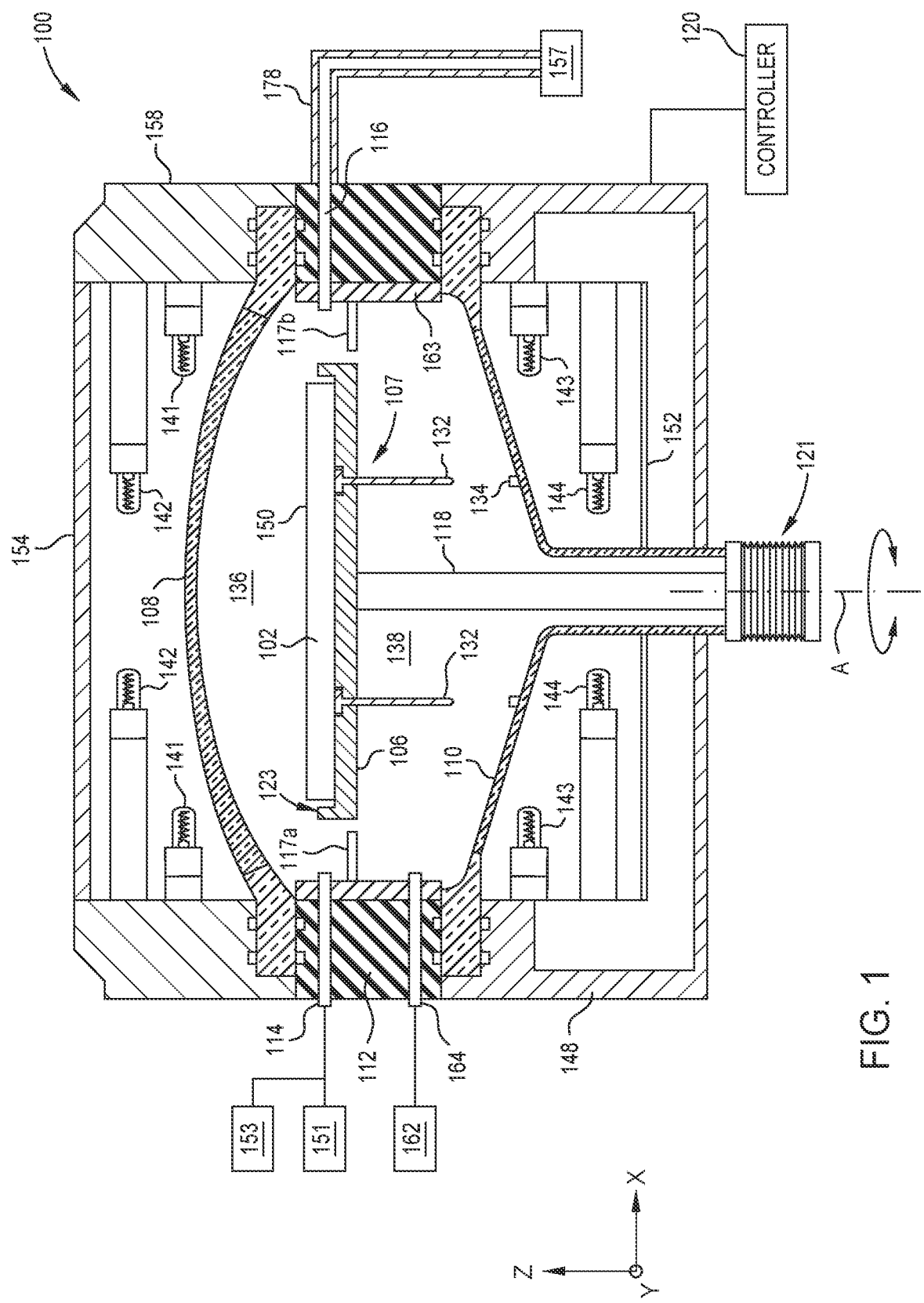
FIG. 1 is a schematic side cross-sectional view of a processing chamber, according to one or more embodiments.

FIG. 1 is a schematic side cross-sectional view of a processing chamber 100, according to one or more embodiments. The processing chamber 100 is a deposition chamber. In one or more embodiments, which can be combined with other embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102.

The processing chamber 100 includes an upper body 158, a lower body 148 disposed below the upper body 158, a flow module 112 disposed between the upper body 158 and the lower body 148. The upper body 158, the flow module 112, and the lower body 148 form a chamber body. Disposed within the chamber body is a substrate support 106 (e.g., a susceptor), an upper window 108 (such as an upper dome), a lower window 110 (such as a lower dome), and a plurality of lamps (e.g., incandescent lamps). The plurality of lamps may be adapted to emit radiation (e.g., infrared radiation, optical radiation) towards the substrate 102 to elevate the temperature thereof (e.g., to a desired processing temperature). For example, the lamps may be adapted to emit radiation in the wavelength range of about 300 nm to about 5,000 nm, and/or infrared (IR) radiation. In some embodiments, the lamps may be adapted to emit a peak filament power at a wavelength of about 950 nm or more. The lamps may be arranged symmetrically (e.g., in a generally ring-like formation) about a central axis of the processing chamber 100. The lamps may be arranged in one or more regional zones (e.g., zones with common input power; zones providing common susceptor-region heating) As illustrated, the lamps may be identified by four regional zones, such as lamps 141 of the upper outer zone, lamps 142 of the upper inner zone, lamps 143 of the lower outer zone, and lamps 144 of the lower inner zone. Each zone may have one or more lamps (e.g., between 1 and about 50 or more lamps). In some embodiment, the number of lamps in each zone may be identical, while in other embodiments, each zone may contain a different number of lamps (e.g., 12 upper outer zone lamps 141, 20 upper inner zone lamps 142, 32 lower outer zone lamps 143, and 12 lower inner zone lamps 144). In some embodiments, which may be combined with other embodiments, it is contemplated that the plurality of lamps may be arranged according to a different geometry and/or orientation (e.g., vertically). As shown, a controller 120 is in communication with the processing chamber 100 and is used to control processes and methods, such as the operations of the methods described herein. The controller 120 may be adapted to monitor, set, adjust, and/or vary the input power (e.g., as measured by voltage) delivered to the lamps in the different zones to thereby control the radial distribution of radiant energy. For example, the controller 120 may send control signals to an input power supply, wherein the control signals designate an input power level that is based on lamp zone and/or operational process state. Likewise, the controller 120 may modify the set-point of the input power delivered to the lamps. The controller 120 may be adapted to generate alerts based on data collected by various components of the processing chamber 100.

The substrate support 106 is disposed between the upper window 108 and the lower window 110. The substrate support 106 includes a support face 123 that supports the substrate 102. In some embodiments, the substrate support is formed of a material such as silicon carbide coated graphite. The plurality of upper outer zone lamps 141 and the plurality of the upper inner zone lamps 142 are disposed between the upper window 108 and a lid 154. The lid 154 may include a plurality of sensors (e.g., pyrometers; not shown) disposed therein for measuring the temperature within the processing chamber 100. The plurality of lower outer zone lamps 143 and the plurality of the lower inner zone lamps 144 are disposed between the lower window 110 and a floor 152. The upper window 108 is an upper dome and is formed of an energy transmissive material, such as quartz. The lower window 110 is a lower dome and is formed of an energy transmissive material, such as quartz.

A process volume 136 and a purge volume 138 are formed between the upper window 108 and the lower window 110. The process volume 136 and the purge volume 138 are part of an internal volume defined at least partially by the upper window 108, the lower window 110, and the one or more liners 163.

The internal volume has the substrate support 106 disposed therein. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106 within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position.

The flow module 112 includes a plurality of gas inlets 114, a plurality of the purge gas inlets 164, and one or more gas exhaust outlets 116. The plurality of the gas inlets 114 and the plurality of purge gas inlets 164 are disposed on the opposite side of the flow module 112 from the one or more gas exhaust outlets 116. One or more flow guides 117a, 117b are disposed below the plurality of gas inlets 114 and the one or more gas exhaust outlets 116. The one or more flow guides 117a, 117b are disposed above the purge gas inlets 164. One or more liners 163 are disposed on an inner surface of the flow module 112 and protects the flow module 112 from reactive gases used during deposition operations and/or cleaning operations. The gas inlet(s) 114 and the purge gas inlet(s) 164 are each positioned to flow a gas parallel to the top surface 150 of a substrate 102 disposed within the process volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), and/or nitrogen ($N_2$)). One or more cleaning gases supplied using the one or more cleaning gas sources 153 can include one or more of hydrogen (H) and/or chlorine (Cl). In one or more embodiments, which can be combined with other embodiments, the one or more process gases include silicon phosphide (SiP) and/or phosphine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

Figure 2:
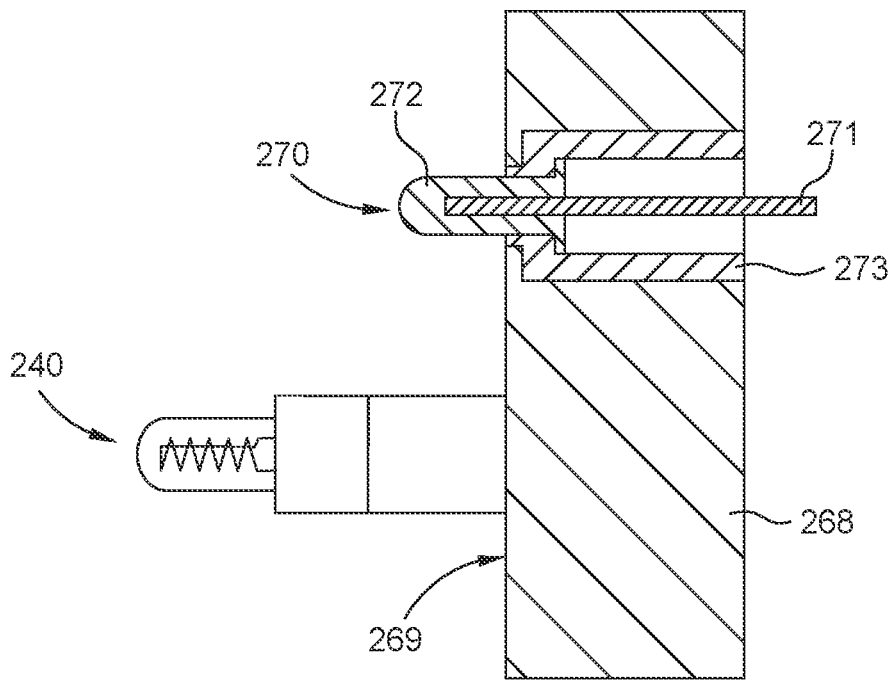
FIG. 2 is a schematic side cross-sectional view of a lamp of the processing chamber shown in FIG. 1, and of a lamp output radiation sensor, according to one or more embodiments.

FIG. 2 is an enlarged view of one of the aforementioned lamps, such as any of the upper outer zone lamps 141, the upper inner zone lamps 142, the lower outer zone lamps 143, and/or the lower inner zone lamps 144. As illustrated, the lamp 240 is coupled to the wall 268 (e.g., an interior wall of the upper body 158 or the lower body 148, for example, an interior reflector or deflector). The coupling may provide both structural support and input power to the lamp 240. The coupling may also convey sensor readings and/or control signals between the lamp 240 and other components of the processing chamber 100, such as the controller 120. In some embodiments, a surface 269 (e.g., proximal lamp 240) of the wall 268 may be adapted to direct (e.g., reflect) optical radiation towards the substrate 102 to provide more efficient heating thereof.

FIG. 2 also illustrates a radiation sensor 270. The radiation sensor 270 may be disposed (e.g., coupled to the wall 268, and/or to another interior wall of the upper body 158 or the lower body 148) proximal lamp 240. The radiation sensor 270 may be adapted to preferentially detect radiation of the type emitted by the lamp 240 (e.g., radiation in the wavelength range of about 300 nm to about 5,000 nm, and/or infrared (IR) radiation). To have minimal impact on the processing environment, the radiation sensor 270 may have small physical size and/or thermal mass (e.g., less than 10% of that of the lamp 240). The radiation sensor 270 may contain a sensor unit 271, a low thermal mass sensor cap 272, and a shielding base 273. For example, the sensor unit 271 may be a resistive temperature detector (RTD), a thermocouple (TC), a pyrometer, and/or other type of radiation detector. The sensor unit 271 may have a sensor cap 272 that contains material similar to that of the substrate support 106 (e.g., silicon carbide coated graphite). It is currently believed that the similar material will provide a similar heating absorption spectrum for both the radiation sensor 270 and the substrate support 106. Further, the sensor cap 272 may protect the sensor unit 271 from exposure to the materials and gases within the processing chamber 100. The shielding base 273 may thermally isolate the radiation sensor 270 from the support structure (e.g., wall 268). In some embodiments, the shielding base 273 may contain opaque quartz. In some embodiments, a single radiation sensor 270 is disposed proximal a plurality of lamps 240. For example, each of the aforementioned zones may have a single associated radiation sensor. In other words, each radiation sensor 270 is identified with a single zone, and each zone is identified with a single radiation sensor. In some embodiments, one or more radiation sensors 270 may be associated with (e.g., detect radiation from) one or more lamps 240, while each of the associated lamps 240 are all in a single one of the aforementioned zones. In other words, each radiation sensor 270 is identified with a single zone, but at least one zone is identified with more than one radiation sensor 270. In some embodiments, a radiation sensor 270 may be adapted to only detect radiation from a single zone, for example with the use of opaque deflectors positioned between the radiation sensor and the non-associated zones.

The radiation sensor 270 is adapted to detect radiation emitted by the associated lamp(s) 240 and convey information about the detected radiation to the controller 120. For example, the information may be in the form of an energy spectrum and/or a temperature measurement. The information may be specific to a narrow wavelength band, one or more wavelength band, and/or a broadband energy spectrum. The radiation sensor 270 transmits the information to the controller 120 in the form of data. The controller 120 receives the data from each of the radiation sensors 270. The controller 120 analyzes the data to detect relative changes in detected radiation. For example, for each zone, the controller may monitor input power to the lamps and the associated radiation output. The input power and associated radiation output may be compared over time for a single zone, between or amongst different zones, and/or any combination thereof. For example, a function of radiation over time may be weighted by input power. In some embodiments, the controller may generate an alert when the monitoring identifies a condition associated with lamp aging. For example, the monitoring may identify a substantial difference (e.g., greater than 3%) in input power-weighted radiation output, in comparison over time and/or in comparison to other zones. In some embodiments, the alert indicates a replacement instruction for the respective lamp 240. The alert may indicate that the respective lamp 240 could subsequently fail within a specified time frame, such as within a certain number of weeks or months of operation. Additionally, or alternatively, the alert may instruct an operator to replace the respective lamp 240. The alert may be displayed on a user interface.

In some embodiments (not shown), one or more cameras may be utilized in conjunction with the radiation sensors 270 to monitor the lamps 240. For example, one or more cameras may optically monitor the lamps 240 and convey resultant images and/or information to the controller 120. In some embodiments, each camera may capture images of light emitted from the lamps. In some embodiments, each camera may be identified with a single zone. In some embodiments, the images may be analyzed to detect a condition associated with lamp aging (e.g., lamp filament position change, filament sagging, filament breakage, short-circuiting between filament turns, and/or deposition on the envelope of a lamp). For example, the controller 120 may analyze the images to detect lamp aging. In some embodiments, based on the aforementioned detected changes in radiation from the radiation sensors, the controller may be triggered to analyze the images to detect lamp aging. In some embodiments, the alert triggered by monitoring the radiation from the radiation sensors may be augmented by the analysis of the images. For example, monitoring the radiation in a particular zone may generate an alert, which triggers the controller to analyze the images from that zone, which results in the alert being augmented to identify the lamp aging condition with one or more particular lamps of that zone. Suitable cameras and use thereof may be disclosed, for example, in U.S. Pat. No. 11,562,915, which is incorporated by reference herein in its entirety.

Figure 3:
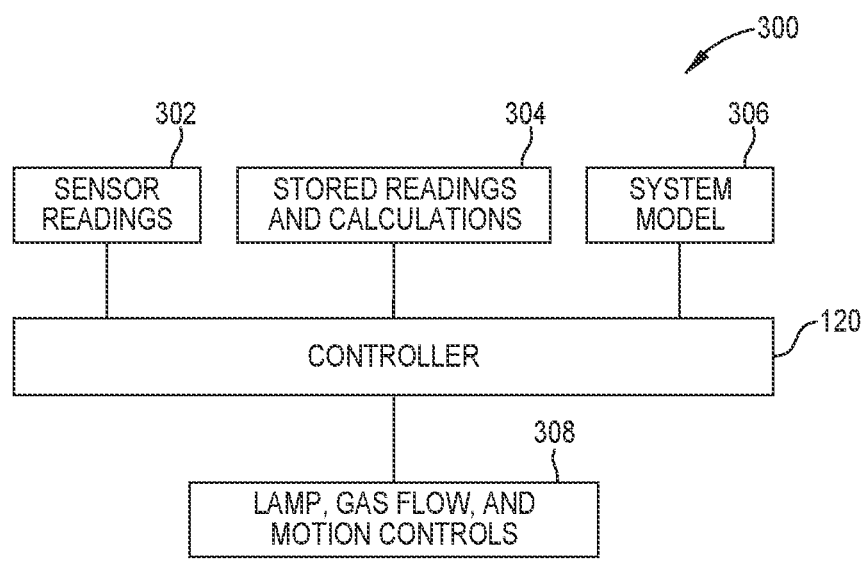
FIG. 3 is a schematic block view of a control system for use within the processing chamber shown in FIG. 1, according to one or more embodiments.

FIG. 3 is a schematic block view of a control system 300 for use with the processing chamber 100 shown in FIG. 1, according to one or more embodiments. The controller 120 is configured to receive data or input as the sensor readings 302 from a plurality of sensors. The sensors can include, for example, sensors that monitor growth of layer(s) on the substrate 102 and/or sensors that monitor growth or residue on inner surfaces of chamber components of the processing chamber 100 (such as inner surfaces of the upper window 108 and the one or more liners 163). The sensors may also include the radiation sensors 270 and/or the cameras for monitoring the lamps 240. The controller 120 is equipped with or in communication with a system model 306 of the processing chamber 100. The system model 306 includes a heating model, a rotational position model, a gas flow model, and a lamp-aging model (e.g., lamp resistance shift from new lamp to aged lamp). The system model 306 is a program configured to estimate parameters (such as the gas flow rate the gas pressure, the rotational position of component(s), and the heating profile) within the processing chamber 100 throughout a deposition operation and/or a cleaning operation. The controller 120 is further configured to store readings and calculations 304.

The readings and calculations 304 include previous sensor readings 302, such as any previous sensor readings within the processing chamber 100. The readings and calculations 304 further include the stored calculated values from after the sensor readings 302 are measured by the controller 120 and run through the system model 306. Therefore, the controller 120 is configured to both retrieve stored readings and calculations 304 as well as save readings and calculations 304 for future use. Maintaining previous readings and calculations enables the controller 120 to adjust the system model 306 over time to reflect a more accurate version of the processing chamber 100. For example, an energy spectrum and/or a temperature measurement made during a calibration or set-up phase may be stored as a "fingerprint" of one or more of the lamps. This fingerprint information can be later compared with subsequent information from the radiation sensors to detect lamp radiation drift. In some embodiments, the controller may adjust the input power to the lamps to maintain the radiation emitted (power and/or wavelength) during certain operations and/or operational process state. For example, controller 120 may send control signals to an input power supply, wherein the control signals designate an input power level that is based on stored fingerprint, radiation drift, lamp zone, and/or operational process state. The controller 120 may analyze the readings and calculations 304 according to the zone from whence it originated. The controller 120 may thereby adjust the input power to the lamps of a particular zone to maintain the radiation emitted from that zone during certain operations and/or operational process state.

The controller 120 includes a central processing unit (CPU), a memory containing instructions, and support circuits for the CPU. The controller 120 controls various items directly, or via other computers and/or controllers. In one or more embodiments, the controller 120 is communicatively coupled to dedicated controllers, and the controller 120 functions as a central controller.

The controller 120 is of any form of a general-purpose computer processor that is used in an industrial setting for controlling various substrate processing chambers and equipment, and sub-processors thereon or therein. The memory, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits of the controller 120 are coupled to the CPU for supporting the CPU (a processor). The support circuits include cache, power supplies, clock circuits, input/output circuitry and subsystems, and the like. Operational parameters (a pressure for process gas, a flow rate for process gas, and/or a rotational position of a process kit) and operations are stored in the memory as a software routine that is executed or invoked to turn the controller 120 into a specific purpose controller to control the operations of the various chambers/modules described herein. The controller 120 is configured to conduct any of the operations described herein. The instructions stored on the memory, when executed, cause one or more of operations of method 500 (described below) to be conducted.

The various operations described herein (such as the operations of the method 500) can be conducted automatically using the controller 120, or can be conducted automatically or manually with certain operations conducted by a user.

In one or more embodiments, the controller 120 includes a mass storage device, an input control unit, and a display unit (not shown). The controller 120 monitors the process gas, and purge gas flow. In one or more embodiments, the controller 120 includes multiple controllers 120, such that the stored readings and calculations 304 and the system model 306 are stored within a separate controller from the controller 120 which operations the processing chamber 100. In one or more embodiments all of the system model 306 and the stored readings and calculations 304 are saved within the controller 120.

The controller 120 is configured to control the rotational position, the heating, and gas flow through the processing chamber 100 by providing an output to the controls 308 for the lamps, the gas flow, and the motion assembly 121. The controls 308 include controls for the upper outer zone lamps 141, the upper inner zone lamps 142, the lower outer zone lamps 143, the lower inner zone lamps 144, the process gas source 151, the purge gas source 162, the motion assembly 121, and the exhaust pump 157.

The controller 120 is configured to adjust the output to the controls 308 based off of the sensor readings 302, the system model 306, and the stored readings and calculations 304. For example, controller 120 may send control signals to an input power supply, wherein the control signals designate an input power level that is based on the sensor readings 302, the system model 306, and/or the stored readings and calculations 304. The controller 120 may send individualized control signals to input power supplies for each zone. The controller 120 includes embedded software and a compensation algorithm to calibrate measurements. The controller 120 can include one or more machine learning algorithms and/or artificial intelligence algorithms that estimate optimized parameters for the deposition operation and/or the cleaning operations. The one or more machine learning algorithms and/or artificial intelligence algorithms can use, for example, a regression model (such as a linear regression model) or a clustering technique to estimate optimized parameters. The algorithm can be unsupervised or supervised.

In one or more embodiments, a controller 120 may be configured to: (a) send a control signal to an input power supply to regulate input power to one or more lamps 240 (e.g., lamps of a particular zone); (b) repeatedly obtain radiation measurements from one or more radiation sensors 270 (e.g., radiation sensors of a particular zone); (c) compare the obtained radiation measurements to a target radiation output; and (d) maintain input power of the one or more lamps within 3% of the target radiation output by sending a control signal to the apparatus to selectively adjust the input power for the one or more lamps (e.g., lamps of a particular zone).

Figure 4:
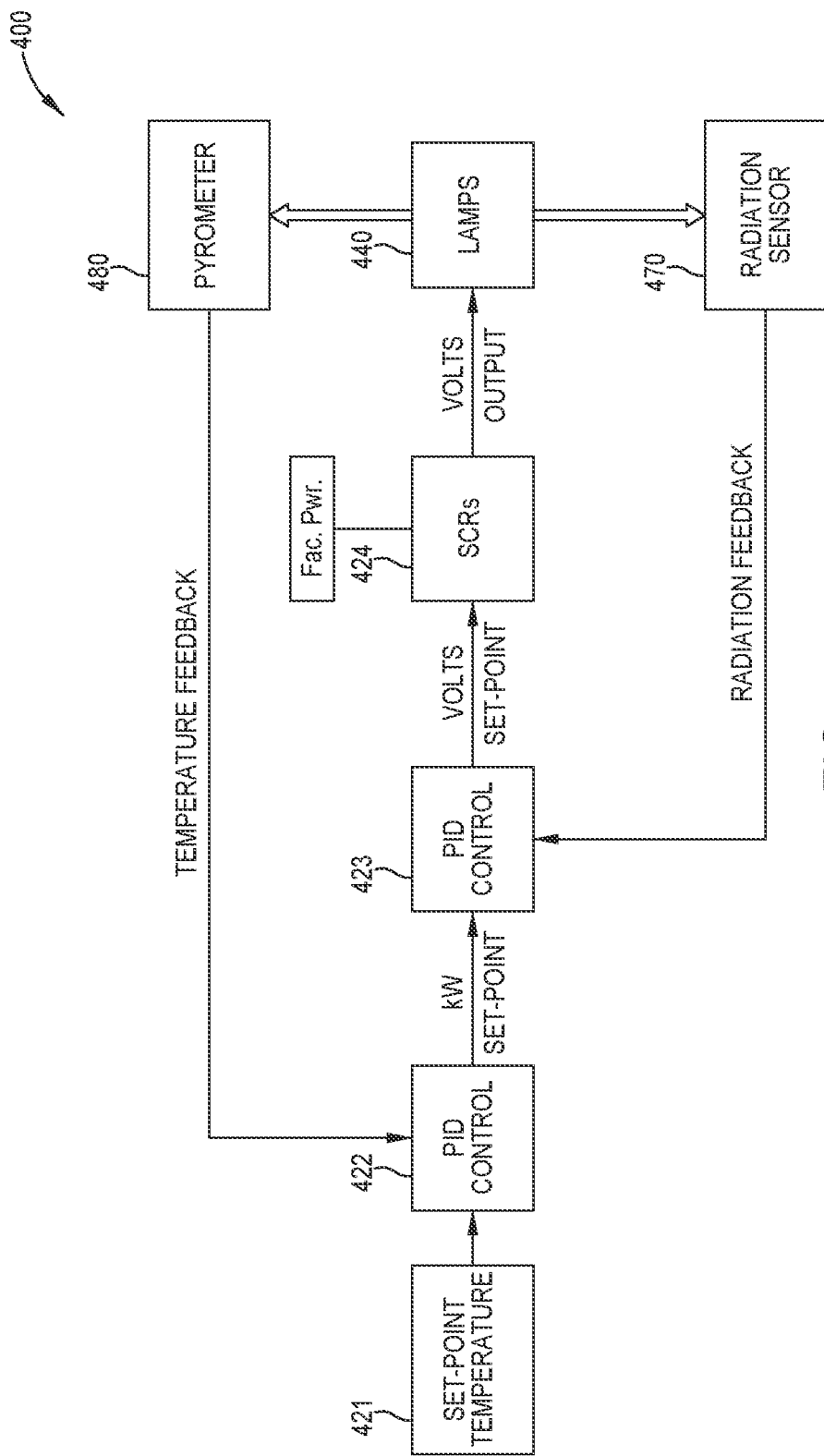
FIG. 4 is a schematic block view of a control feedback loop for use within the processing chamber shown in FIG. 1, according to one or more embodiments.

FIG. 4 is a schematic block view of a control feedback loop 400 for use within the processing chamber shown in FIG. 1, according to one or more embodiments. The control feedback loop 400 may be used to monitor, set, and/or vary the amount of input power delivered to one or more of the lamps 240. For example, the control system 300 may implement the control feedback loop 400 to monitor and/or the control lamps 240. In some embodiments, each of the aforementioned zones will employ a separate control feedback loop 400. For example, for a given zone (e.g., the upper outer zone), an initial set-point temperature 421 will be identified. The set-point temperature may be based on desired operational conditions within the processing chamber 100. The set-point temperature 421 may be identified with one or more particular locations within the processing chamber 100, such as at the axial center of top surface 150 of the substrate 102. The set-point temperature 421 may be initially input into a component of the control system 300. As illustrated in FIG. 4, the set-point temperature is initially input into a PID control 422, which has been adapted to adjust an electrical power supply for the respective zone based on a temperature reading. Thus, the initial input of set-point temperature 421 into the PID control 422 results in an electrical power set-point.

The electrical power set-point of the PID control 422 is fed into a PID control 423, which has been adapted to adjust an electrical voltage supply for the respective zone based on the electrical power set-point and information about radiation emitted from the respective lamps (shown here as lamps 440).

The electrical voltage supply of the PID control 423 is fed into SCRs 424, which has been adapted to adjust the Facility Power for the respective zone based on the electrical voltage supply of the PID control 423 to an electrical voltage output.

The electrical voltage output from SCRs 424 provides input power to the lamps 440 of the respective zone. With that input power, the energy emitted from the lamps, in the form of heat and radiation, may be set, adjusted, and/or varied.

The feedback loop 400 provides two feedback mechanisms. Heat from the lamps 440 may be detected by the pyrometers 480 for the respective zone. Thus, temperature feedback may be provided from the pyrometers 480 to the PID control 422. Likewise, radiation from the lamps 440 may be detected by the radiation sensors 470 for the respective zone. Thus, radiation feedback may be provided from the radiation sensors 470 to the PID control 423. Taken together, the two feedback mechanisms of the control feedback loop 400 may be used to monitor, set, and/or vary the amount of input power delivered to one or more of the lamps. For example, the control system 300 may send control signals to the PID control 423, wherein the control signals designate an input power level that is based on the current electrical power set-point, and/or the radiation feedback from the radiation sensors 470. In some embodiments, either or both of the feedback mechanisms may be repeated multiple times. For example, the feedback loop 400 may connect the controller 120 to a means for radiation measuring (e.g., radiation sensor 270) to repeatedly measure the radiation output of one or more of the lamps 240. In some embodiments, the control signals may be specific to one zone of the processing chamber.

The control system 300 can include one or more machine learning algorithms and/or artificial intelligence algorithms that may implement, adjust and/or refine one or more algorithms, inputs, outputs or variables described above. Additionally or alternatively, the one or more machine learning algorithms and/or artificial intelligence algorithms may rank or prioritize certain aspects of adjustments of the feedback loop 400 relative to other aspects of the feedback loop 400. The one or more machine learning algorithms and/or artificial intelligence algorithms may account for other changes within the processing systems such as hardware replacement and/or degradation. In another example, the one or more machine learning algorithms and/or artificial intelligence algorithms may account for upstream or downstream changes that may occur in the processing system due to variable changes of the feedback loop 400. For example, if variable "A" is adjusted to cause a change in aspect "B"

of the process, and such an adjustment unintentionally causes a change in aspect "C" of the process, then the one or more machine learning algorithms and/or artificial intelligence algorithms may take such a change of aspect "C" into account. In such an example, the one or more machine learning algorithms and/or artificial intelligence algorithms embody predictive aspects related to implementing the feedback loop 400. The predictive aspects can be utilized to preemptively mitigate unintended changes within a processing system. The one or more machine learning algorithms and/or artificial intelligence algorithms can use, for example, a regression model (such as a linear regression model) or a clustering technique to estimate optimized parameters. The algorithm can be unsupervised or supervised.

Figure 5:
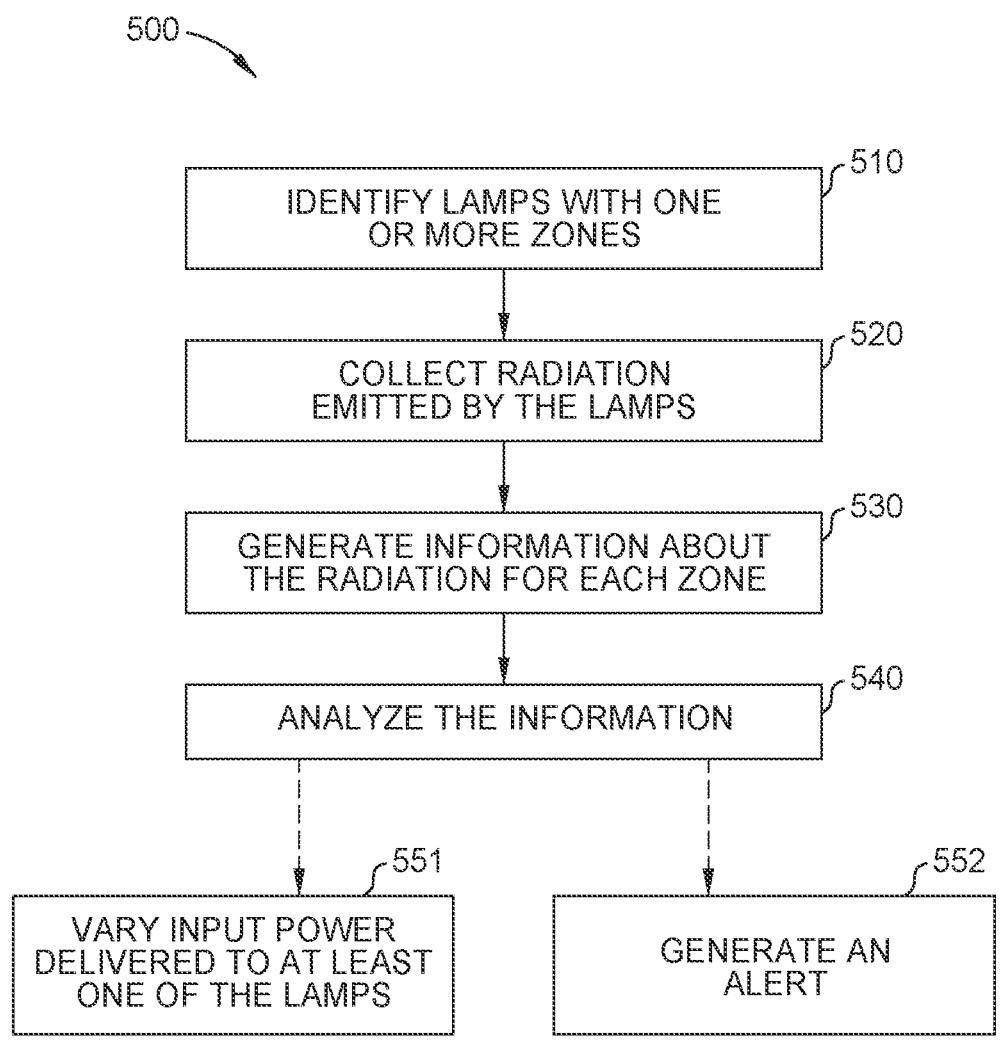
FIG. 5 is a block diagram of a method of monitoring a plurality of lamps of a processing chamber, according to one or more embodiments.

FIG. 5 is a block diagram of a method 500 of monitoring a plurality of lamps of a processing chamber, according to one or more embodiments. The method 500 begins at operation 510, which includes identifying each of the lamps with one or more zones. The method 500 proceeds to operation 520, which includes collecting radiation emitted by the lamps. For example, radiation sensors may monitor the radiation emitted by the lamps. The radiation sensors may constantly and/or intermittently measure the radiation emitted by the lamps. In some embodiments, the radiation sensors may collect data according to an automated schedule, which may be adjusted by the controller as operational parameters change over time. The method 500 proceeds to operation 530, which includes generating information about the radiation for each zone. For example, the information may include an absorption spectrum. In some embodiments, the information may be designated and/or subdivided by zone of the processing chamber. The method 500 proceeds to operation 540, which includes analyzing the information.

Based on the analyzing of operation 540, the method 500 proceeds to either operation 551 or operation 552 (or both). Operation 551 includes varying the input power delivered to at least one of the lamps. For example, the input power may be varied based on, inter alia, the aforementioned fingerprint of one or more of the lamps. The controller may automatically vary the input power according to an automated schedule, which may be adjusted by the controller as operational parameters change over time. In some embodiments, the controller may adjust the input power differently for different zones. Operation 552 includes generating an alert. For example, the alert may indicate a replacement instruction for a respective lamp. In some embodiments, which can be combined with other embodiments, the replacement instruction instructs an operator (such as on a display of a user interface) to replace the respective lamp. The operator can then replace the respective individual lamp without necessarily replacing any other lamp to reduce machine downtime, reduce costs and resource expenditure, and increase throughput of substrates by the processing chamber. The respective individual lamp can be replaced before the lamp actually fails. In some embodiments, which can be combined with other embodiments, the replacement instruction provides the operator with an estimate of the remaining life, such as the remaining useful life, of the respective lamp. The operator may use such remaining life estimates for each lamp in order to plan and execute appropriate maintenance activities to reduce machine downtime, reduce costs and resource expenditure, and increase throughput of substrates by the processing chamber.

Furthermore, the embodiments of the present disclosure (such as the embodiments of the middle plate) are modular and can be used across a variety of processing (e.g., deposition) operations and/or cleaning operations, including across a variety of operation parameters. Moreover, one or more aspects, features, components, operations and/or properties of the various process kits (such as the middle plates) described herein can be selected, combined, and/or modified depending on the processing parameters (such as flow rate, temperature, pressure, and/or gas composition) used in the processing operations and/or cleaning operations.

It is contemplated that one or more aspects disclosed herein may be combined. As an example, one or more aspects, features, components, operations and/or properties of the processing chamber 100, the controller 120, the lamps 240, the radiation sensors 270, the control system 300, the control feedback loop 400, and/or the method 500 may be combined. Moreover, it is contemplated that one or more aspects disclosed herein may include some or all of the aforementioned benefits.

Embodiments of the present disclosure further relate to any one or more of the following Embodiments 1-21:

1. A system for processing substrates, comprising: a processing chamber comprising a processing volume; a plurality of lamps coupled to the processing chamber, wherein each of the lamps is identified with one or more zones; one or more radiation sensors coupled to the processing chamber, wherein each radiation sensor is proximal at least one lamp; and a controller comprising instructions that, when executed by a processor, cause: the one or more radiation sensors to convey, to the controller, information associated with radiation emitted by the plurality of lamps; the controller to analyze the information, the analyzing comprising: for each zone: determining a function of radiation over time; and monitoring the function for a first condition associated with lamp aging; and the controller to, based on the analyzing the information, perform at least one of the following actions: vary input power delivered to at least one of the lamps; and generate an alert.

2. The system according to Embodiment 1, wherein the one or more zones comprise: an upper outer zone; an upper inner zone; a lower outer zone; and a lower inner zone.

3. The system according to Embodiment 1 or 2, wherein each radiation sensor is identified with a single zone of the one or more zones.

4. The system according to any one of Embodiments 1-3, wherein at least one zone is associated with more than one radiation sensor.

5. The system according to any one of Embodiments 1-4, further comprising: one or more cameras, wherein the instructions that, when executed by a processor, further cause: the one or more cameras to convey, to the controller, a plurality of images of light emitted from the lamps; the controller to analyze the images to detect a second condition associated with lamp aging; and the controller to augment the alert based on the analyzing the images.

6. The system according to any one of Embodiments 1-5, wherein each camera of the one or more cameras is identified with a single zone of the one or more zones.

7. The system according to any one of Embodiments 1-6, wherein the alert indicates a replacement instruction for at least one lamp of the respective zone.

8. The system according to any one of Embodiments 1-7, wherein the alert indicates an estimated remaining life of at least one lamp of the respective zone.

9. A method of monitoring a plurality of lamps of a processing chamber, comprising: identifying each of the lamps with one or more zones; collecting radiation emitted by the plurality of lamps; generating information about the collected radiation for each zone; analyzing the information, the analyzing comprising: for each zone: determining a function of radiation over time; and monitoring the function for a first condition associated with lamp aging; and based on the analyzing the information, performing at least one of the following actions: varying input power delivered to at least one of the lamps; and generating an alert.

10. The method according to Embodiment 9, wherein the one or more zones comprise: an upper outer zone; an upper inner zone; a lower outer zone; and a lower inner zone.

11. The method according to Embodiment 9 or 10, wherein a plurality of radiation sensors are utilized to collect the radiation.

12. The method according to Embodiment 11, wherein each radiation sensor is identified with a single zone of the one or more zones.

13. The method according to Embodiment 11 or 12, wherein at least one zone is associated with more than one radiation sensor.

14. The method according to any one of Embodiments 9-13, wherein the function comprises an input power-weighted radiation output.

15. The method according to any one of Embodiments 9-14, wherein the analyzing the information further comprises comparing the function of radiation over time of one of the zones with the function of radiation over time of another of the zones.

16. The method according to any one of Embodiments 9-15, further comprising: capturing a plurality of images of light emitted from the lamps using one or more cameras; analyzing the images to detect a second condition associated with lamp aging; and augmenting the alert based on the analyzing the images.

17. The method according to Embodiment 16, wherein each camera of the one or more cameras is identified with a single zone of the one or more zones.

18. The method according to any one of Embodiments 9-17, wherein the alert indicates at least one of: a replacement instruction for at least one lamp of the respective zone; and an estimated remaining life of at least one lamp of the respective zone.

19. A method of monitoring a plurality of lamps of a processing chamber, comprising: and of the systems according to any one of Embodiments 1-8.

20. A non-transitory computer readable storage medium having stored thereon, computer-executable instructions that, when executed by a processor, cause the processor to perform a method of monitoring a plurality of lamps of a processing chamber, the method comprising: identifying each of the lamps with one or more zones; collecting radiation emitted by the plurality of lamps; generating information about the collected radiation for each zone; analyzing the information, the analyzing comprising: for each zone: determining a function of radiation over time; and monitoring the function for a first condition associated with lamp aging; and based on the analyzing the information, performing at least one of the following actions: varying input power delivered to at least one of the lamps; and generating an alert.

21. A radiation sensor for a processing chamber for processing substrates, the radiation sensor comprising: a sensor unit capable of detecting radiation in a wavelength range of about 300 nm to about 5,000 nm; a sensor cap that caps the sensor unit and comprises silicon carbide coated graphite; and a shielding base capable of thermally isolating the sensor unit from its support structure, wherein: the radiation sensor is configured to detect radiation emitted by one or more of a plurality of lamps of the processing chamber, each of the plurality of lamps is identified with one or more zones of the processing chamber, and the radiation sensor is configured to generate information about the detected radiation for one of the zones.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that any stated range of numerical values includes the lower endpoint value and the upper endpoint value, unless otherwise indicated. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A system for processing substrates, comprising:
   a processing chamber comprising a substrate support within a processing volume;
   a plurality of lamps coupled to the processing chamber, the plurality of lamps comprising:
      each of the plurality of lamps is identified with one or more zones,
      an upper plurality of lamps, the upper plurality of lamps comprising two or more upper outer zone lamps in an upper outer zone and two or more upper inner zone lamps in an upper inner zone, and the upper plurality of lamps is disposed above the processing volume between an upper window and a lid; and
      a lower plurality of lamps, the lower plurality of lamps comprising two or more lower outer zone lamps in a lower outer zone and two or more lower inner zone lamps in a lower inner zone, and the lower plurality of lamps is disposed below the processing volume between a lower window and a floor;
   one or more radiation sensors coupled to the processing chamber, wherein each radiation sensor is proximal at least one lamp; and
   a controller comprising instructions that, when executed by a processor, cause:

the one or more radiation sensors to convey, to the controller, information associated with radiation emitted by the plurality of lamps;
the controller to analyze the information, the analyzing comprising:
for each zone:
determining a function of radiation over time; and
monitoring the function for a first condition associated with lamp aging; and
the controller to, based on the analyzing the information, perform at least one of the following actions:
vary input power delivered to at least one of the lamps; and
generate an alert.

2. The system of claim 1, wherein each radiation sensor is identified with a single zone of the one or more zones, and wherein at least one zone is associated with more than one radiation sensor.

3. The system of claim 1, further comprising:
one or more cameras, wherein the instructions that, when executed by a processor, further cause:
the one or more cameras to convey, to the controller, a plurality of images of light emitted from the lamps;
the controller to analyze the images to detect a second condition associated with lamp aging; and
the controller to augment the alert based on the analyzing the images.

4. The system of claim 3, wherein each camera of the one or more cameras is identified with a single zone of the one or more zones.

5. The system of claim 1, wherein the alert indicates a replacement instruction for at least one lamp of the respective zone.

6. The system of claim 1, wherein the alert indicates an estimated remaining life of at least one lamp of the respective zone.

7. A method of monitoring a plurality of lamps of a processing chamber, comprising:
identifying each of the lamps with one or more zones;
collecting radiation emitted by the plurality of lamps;
generating information about the collected radiation for each zone;
analyzing the information, the analyzing comprising:
for each zone:
determining a function of radiation over time; and
monitoring the function for a first condition associated with lamp aging; and
based on the analyzing the information, performing at least one of the following actions:
varying input power delivered to at least one of the lamps; and
generating an alert;
wherein the processing chamber further comprises:
a substrate support within a processing volume;
an upper plurality of lamps, the upper plurality of lamps comprising two or more upper outer zone lamps in an upper outer zone and two or more upper inner zone lamps in an upper inner zone, and the upper plurality of lamps is disposed above the processing volume between an upper window and a lid; and
a lower plurality of lamps, the lower plurality of lamps comprising two or more lower outer zone lamps in a lower outer zone and two or more lower inner zone lamps in a lower inner zone, and the lower plurality of lamps is disposed below the processing volume between a lower window and a floor.

8. The method of claim 7, wherein a plurality of radiation sensors are utilized to collect the radiation, and wherein each radiation sensor is identified with a single zone of the one or more zones.

9. The method of claim 8, wherein at least one zone is associated with more than one radiation sensor.

10. The method of claim 7, wherein the function comprises an input power-weighted radiation output.

11. The method of claim 7, wherein the analyzing the information further comprises comparing the function of radiation over time of one of the zones with the function of radiation over time of another of the zones.

12. The method of claim 7, further comprising:
capturing a plurality of images of light emitted from the lamps using one or more cameras;
analyzing the images to detect a second condition associated with lamp aging; and
augmenting the alert based on the analyzing the images.

13. The method of claim 12, wherein each camera of the one or more cameras is identified with a single zone of the one or more zones.

14. The method of claim 7, wherein the alert indicates a replacement instruction for at least one lamp of the respective zone.

15. The method of claim 7, wherein the alert indicates an estimated remaining life of at least one lamp of the respective zone.

16. A system for processing substrates, comprising:
a processing chamber comprising a substrate support within a processing volume;
a plurality of lamps coupled to the processing chamber, the plurality of lamps comprising:
each of the plurality of lamps is identified with one or more zones;
an upper plurality of lamps, the upper plurality of lamps comprising two or more upper outer zone lamps in an upper outer zone and two or more upper inner zone lamps in an upper inner zone, and the upper plurality of lamps is disposed above the processing volume between an upper window and a lid; and
a lower plurality of lamps, the lower plurality of lamps comprising two or more lower outer zone lamps in a lower outer zone and two or more lower inner zone lamps in a lower inner zone, and the lower plurality of lamps is disposed below the processing volume between a lower window and a floor;
one or more radiation sensors coupled to the processing chamber, wherein each radiation sensor is proximal at least one lamp, and wherein each the radiation sensor comprises:
a sensor unit capable of detecting radiation in a wavelength range of about 300 nm to about 5,000 nm;
a sensor cap that caps the sensor unit and comprises silicon carbide coated graphite; and
a shielding base capable of thermally isolating the sensor unit from its support structure; and
a controller comprising instructions that, when executed by a processor, cause:
the one or more radiation sensors to convey, to the controller, information associated with radiation emitted by the plurality of lamps;
the controller to analyze the information, the analyzing comprising:
for each zone:
determining a function of radiation over time; and
monitoring the function for a first condition associated with lamp aging; and the controller to, based on the analyzing the information, perform at least one of the following actions:
vary input power delivered to at least one of the lamps; and
generate an alert.

* * * * *